(12) United States Patent
Hopper et al.

(10) Patent No.: US 7,968,913 B2
(45) Date of Patent: Jun. 28, 2011

(54) CMOS COMPATABLE FABRICATION OF POWER GAN TRANSISTORS ON A <100> SILICON SUBSTRATE

(75) Inventors: Peter J. Hopper, San Jose, CA (US); William French, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 241 days.

(21) Appl. No.: 12/315,931

(22) Filed: Dec. 8, 2008

(65) Prior Publication Data

US 2010/0140663 A1 Jun. 10, 2010

(51) Int. Cl.
*H01L 29/778* (2006.01)

(52) U.S. Cl. .......... 257/194; 257/E29.246; 257/E29.249

(58) Field of Classification Search .................. 257/194, 257/E29.246, E29.249
See application file for complete search history.

(56) References Cited

U.S. PATENT DOCUMENTS

| | | | | |
|---|---|---|---|---|
| 4,710,788 A * | 12/1987 | Dambkes et al. | ............. | 257/194 |
| 5,593,908 A * | 1/1997 | Jovanovic et al. | ............. | 438/172 |
| 6,015,981 A * | 1/2000 | Gluck | ............. | 257/194 |
| 6,323,108 B1 * | 11/2001 | Kub et al. | ............. | 438/458 |
| 6,646,293 B2 * | 11/2003 | Emrick et al. | ............. | 257/194 |
| 6,917,096 B2 * | 7/2005 | Sugiyama et al. | ............. | 257/616 |
| 2005/0221547 A1 * | 10/2005 | Yamauchi et al. | ............. | 438/172 |
| 2009/0261346 A1 * | 10/2009 | Chen et al. | ............. | 257/76 |
| 2010/0129992 A1 * | 5/2010 | Murata et al. | ............. | 438/478 |

* cited by examiner

*Primary Examiner* — Victor Mandala
(74) *Attorney, Agent, or Firm* — Jurgen K. Vollrath

(57) ABSTRACT

In an AlGaN channel transistor formed on a <100> orientation silicon wafer, a hole with walls slanted at 54 degrees is etched into the silicon to provide a <111> orientation substrate surface for forming the AlGaN channel transistor.

14 Claims, 6 Drawing Sheets

CMOS COMPATABLE FABRICATION OF POWER GAN TRANSISTORS ON A <100> SILICON SUBSTRATE

FIELD OF THE INVENTION

The invention relates to high voltage transistors. In particular it relates to transistors making use of channel material that has improved carrier mobility and a wider bandgap than silicon, so-called high electron mobility transistors (HEMT).

BACKGROUND OF THE INVENTION

Materials such as GaN provide improved carrier mobility and have a wider band gap than silicon. Therefore the use of GaN as a channel material in the fabrication of transistors has been found to provide transistors with a lower drain-source resistance Rdson. Also, due to the wider band gap the impact ionization is reduced causing the channel breakdown to be much higher. As a result transistors with higher voltage capability can be fabricated or the area of the transistor can be reduced for a given voltage resulting in lower capacitive losses. This allows GaN devices to be run at higher frequencies than silicon transistors of comparable power.

The problem with the use of GaN as a channel material is that to date, defect free, useful epitaxial deposition of GaN is achievable only on <111> orientation silicon substrate material, while CMOS is typically processed on <100> orientation wafers. This places practical constraints on using GaN in conjunction with CMOS processing.

The present application seeks to address this problem.

SUMMARY OF THE INVENTION

According to the invention there is provided a

DETAILED DESCRIPTION OF THE INVENTION

According to the invention, holes are formed, e.g. by etching, in <100> orientation silicon to provide a pit or hole with side-walls angled to define at least one surface with <111> orientation. This allows the fabrication of a channel made of high mobility, wide bandgap material such as GaN on the <111> orientation surface. In particular, in the case of GaN, pits with 54.74 degree sidewall orientation relative to the vertical plane are etched using a wet etch such as KOH/water/ethanol or using TMAH etch.

Another aspect of the invention is to address the drain source resistance Rdson. High voltage applications often make use of power arrays, however as the array increases in size more of the Rdson is dictated by the metal than by the channel resistance. The present invention addresses this problem by making use of a thick copper back-end in one embodiment, as is discussed in greater detail below.

Figure 1:
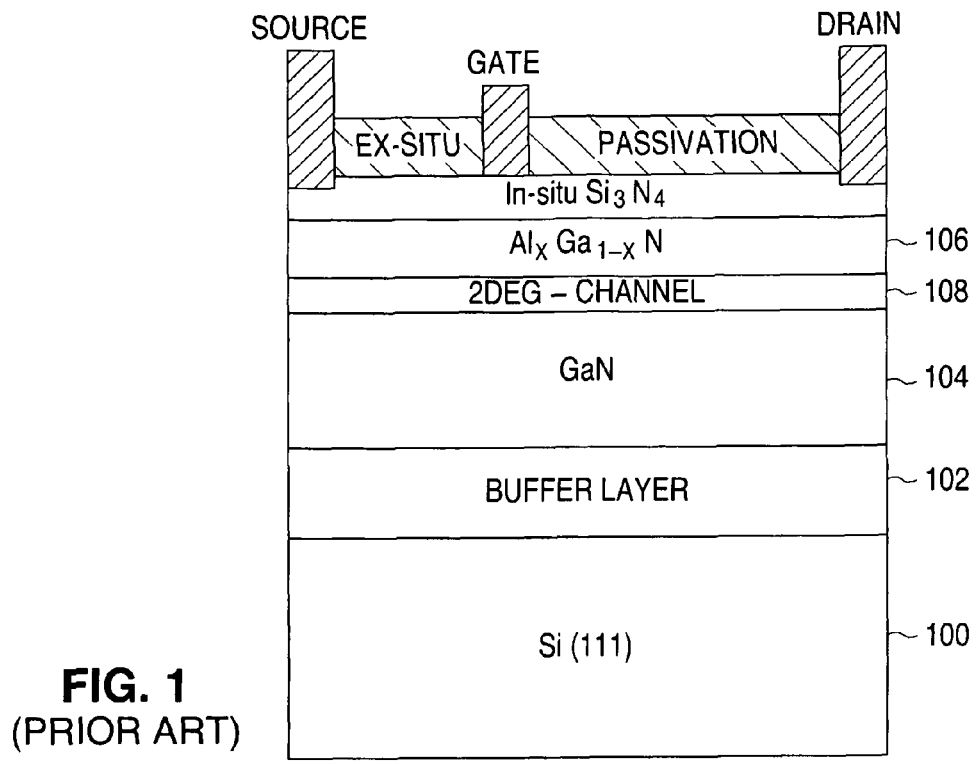
FIG. 1 shows a cross section through a prior art HEMT.
Figure 2:
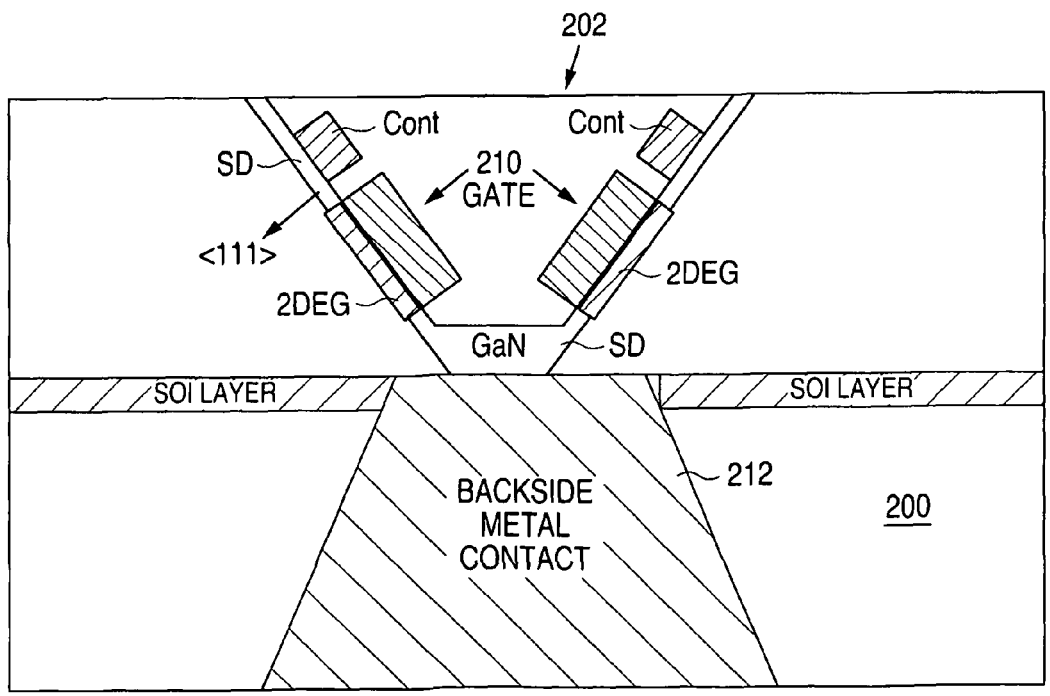
FIG. 2 shows a cross section through a conceptual HEMT of one embodiment of the invention.
Figure 3:
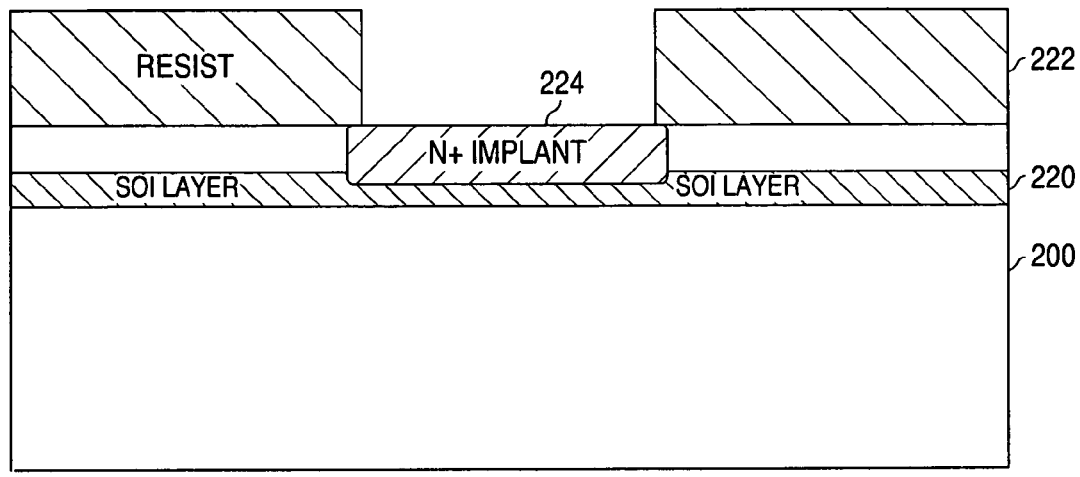
FIGS. 3 to 12 show cross sections through one embodiment of a HEMT of the invention at various stages of fabrication.

In order to better understand the present invention, it is useful to consider the structure of a typical prior art high electron mobility transistor (HEMT) formed on <111> orientation silicon. FIG. 1 shows a section through a typical HEMT transistor formed on <111> orientation silicon substrate. The <111> orientation silicon layer serves as the substrate 100 on which the rest of the transistor is fabricated. Initially a buffer layer 102 is deposited on the substrate 100 followed by a GaN layer 104 that is epitaxially grown on the buffer layer An AlGaN layer 106 is then grown on the GaN layer 104 causing a high electron density accumulation at the interface to define a 2 dimensional electron gas (2 DEG) region 108. In situ Si3Ni4 110 is then formed on the AlGaN 106 followed by the formation of source contact 112, drain contact 114 and gate 116 with ex-situ passivation material 120 between the drain, source and gate. The source and drain contacts diffuse down to the 2 DEG region 108. The present invention, instead starts with <100> orientation silicon as the substrate 200 as shown in FIG. 2 and etches a hole 202 into the substrate 200. In this embodiment in which AlGaN is to be used for the channel material, a hole with sidewalls angled at 54.74 degrees to the vertical is etched using wet etch such as KOH/water/ethanol or using TMAH etch. High electron mobility transistors (HEMT) 210 are then formed on the sidewalls of the hole 202 and a thick backside metal contact 212 is provided for the drain of the transistors, as is discussed in greater detail below. As shown in FIG. 3, a Silicon-on-insulator (SOI) layer 220 is first formed in the substrate 200. Resist 222 is then deposited and patterned to allow n+ region 224 to be formed, which will later serve as the drain, as will become clearer from the discussion below.

Figure 4:
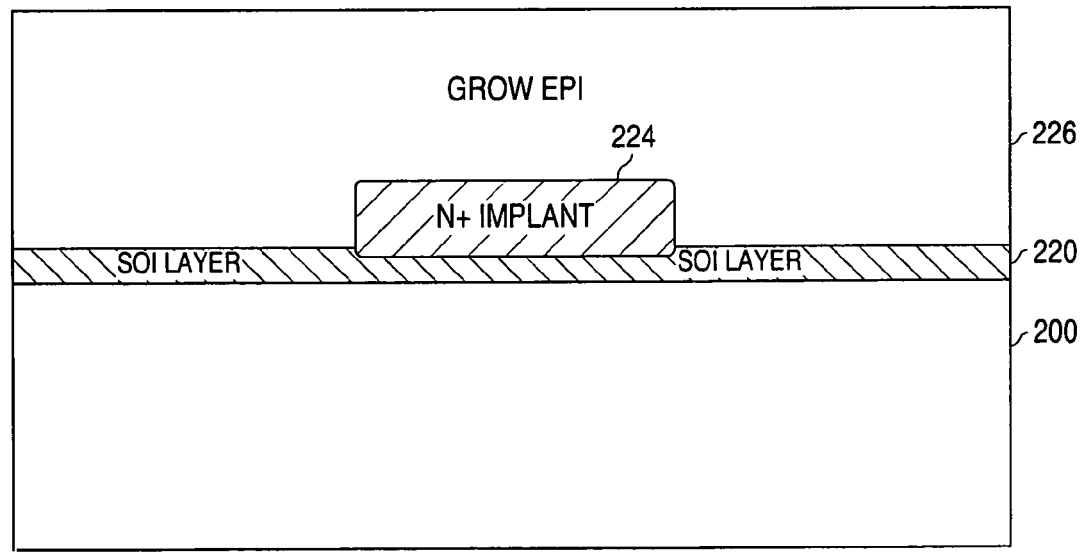

The next step in the fabrication involves the removal of the remaining resist 222 and the growing of an epitaxial layer 226, as shown in FIG. 4.

Figure 5:
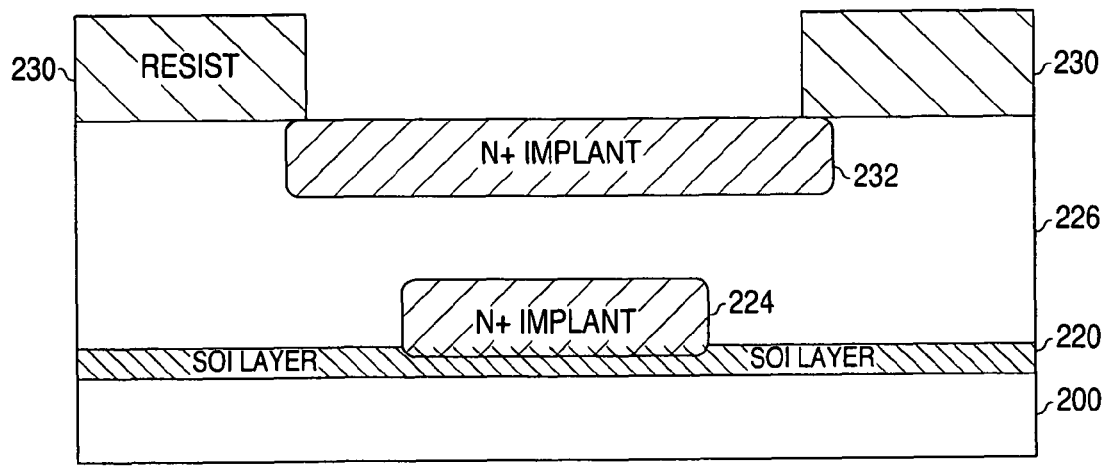

In FIG. 5 resist 230 is again deposited and patterned to allow n+ region 232 to be formed in the epi layer 226. The n+ region 232 will subsequently form the sources of the transistors 210.

Figure 6:
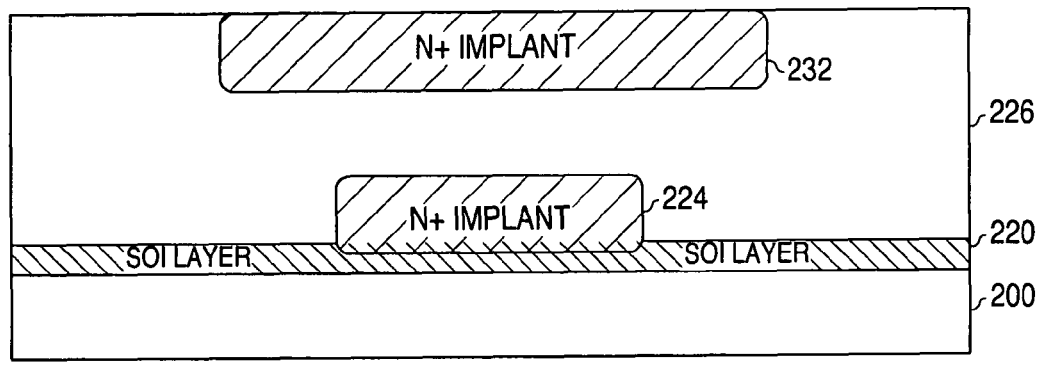

The resist 230 is then removed as shown in FIG. 6.

Figure 7:
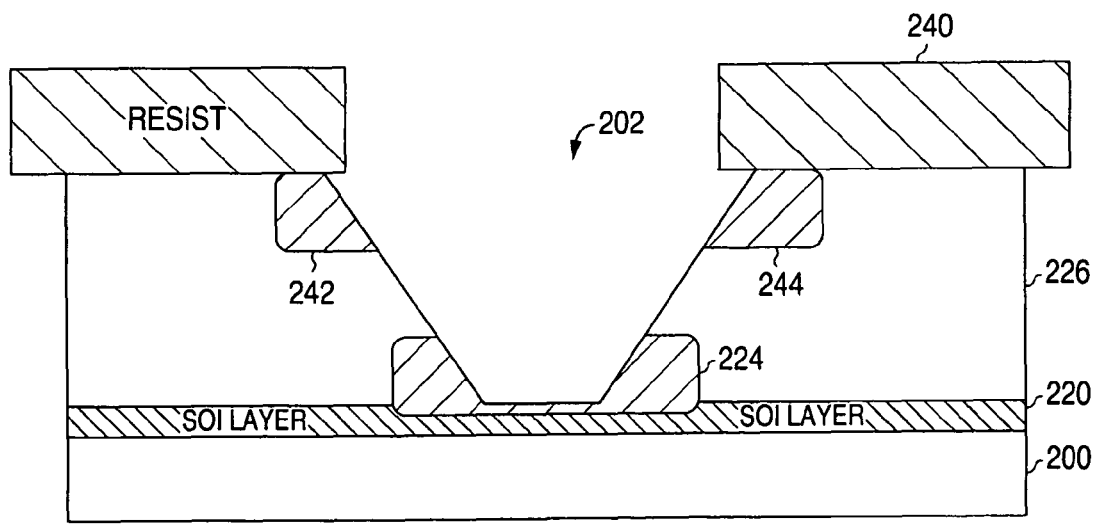

At this point the hole 202 is etched by depositing and patterning a resist layer 240. As shown in FIG. 7, the hole 202 cuts through the n+ region 232 to define two n+ regions 242, 244, and extends down into the n+ region 224.

Figure 8:
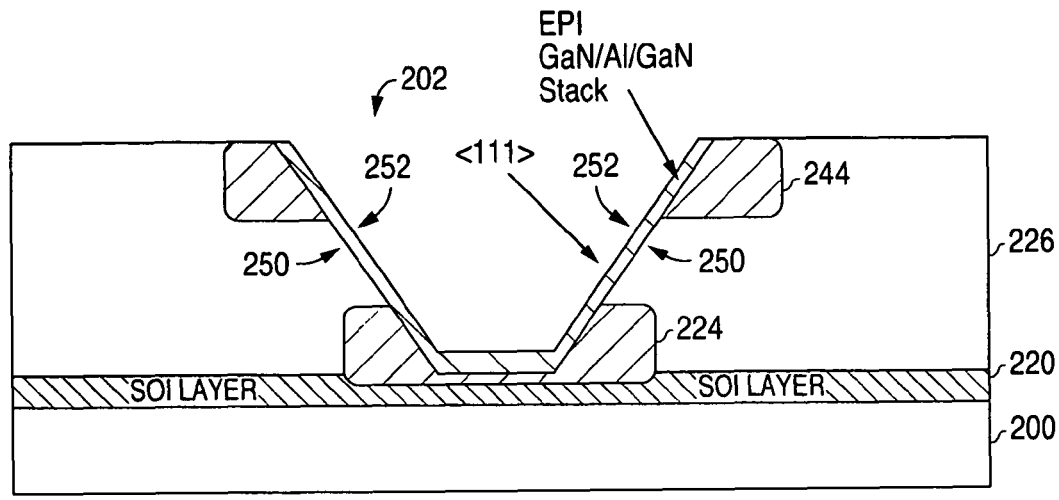
Figure 9:
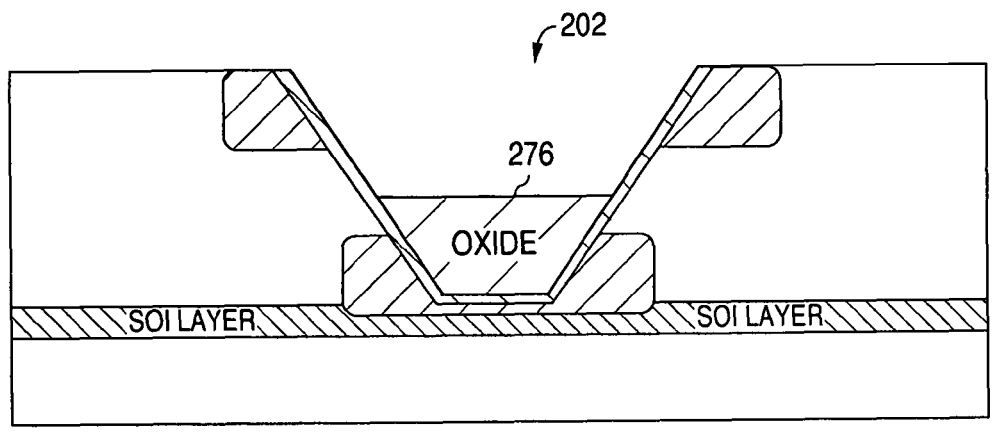

The sidewalls of the hole 202 are angled to provide two surfaces with <111> orientation allowing the growth of a GaN layer 250 and an AlGaN layer 252 on the two sidewalls to define a GaN/AlGaN stack 250 on each of the surfaces as shown in FIG. 8. An oxide layer 260 is then deposited in the hole 202 and etched back as shown in FIG. 9.

Figure 10:
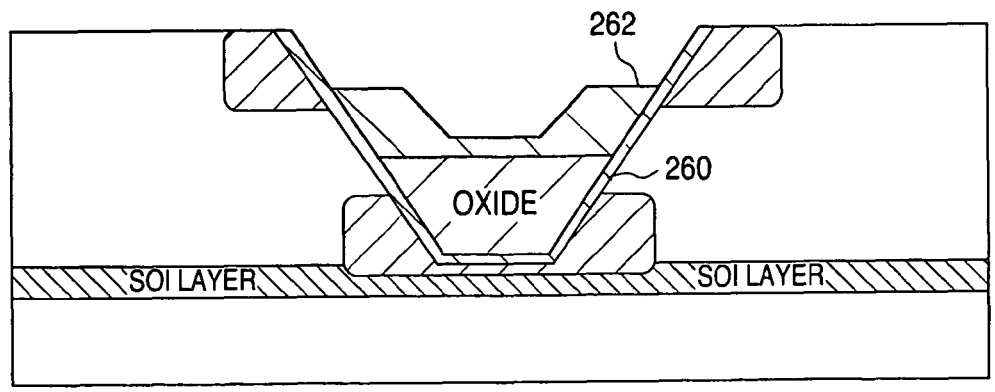
Figure 11:
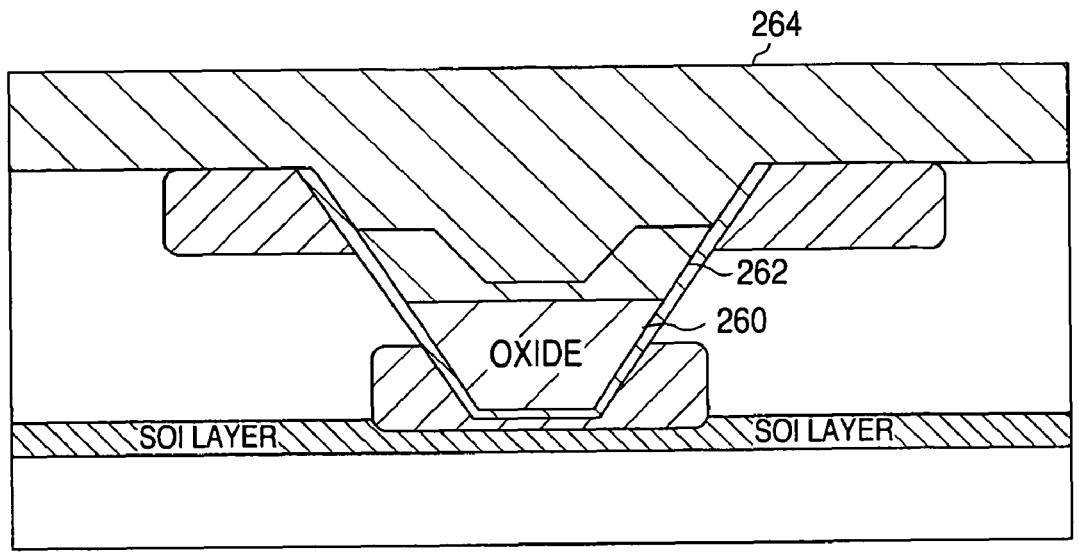

In FIG. 10 gate 262 is deposited on the oxide 260 and etched back to form a gate spacer on which an oxide 264 is deposited and planarized as shown in FIG. 11.

Figure 12:
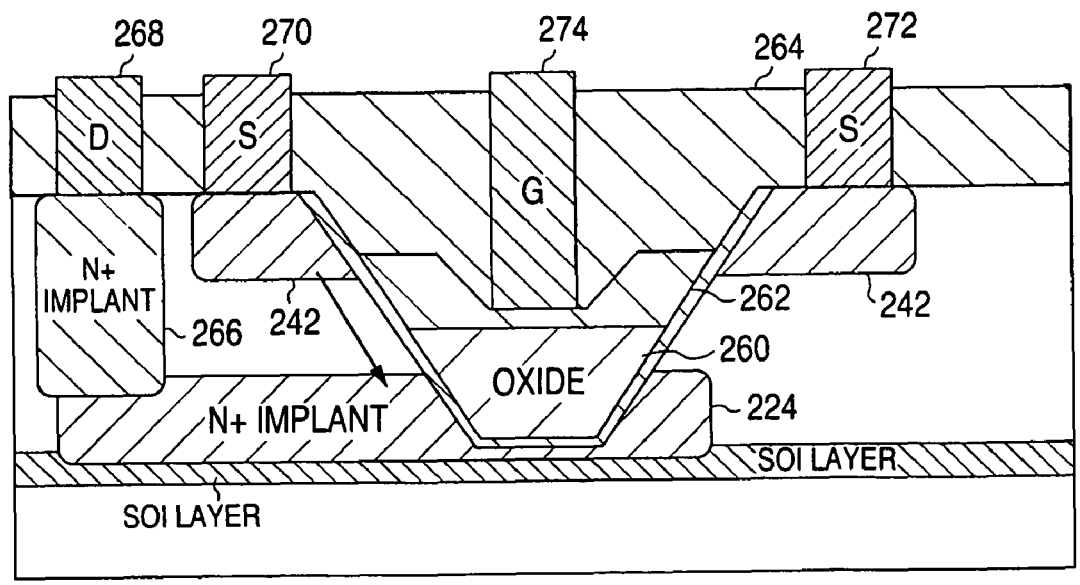

As shown in FIG. 12, an n+ sinker 266 is then implanted to connect with the n+ drain region 224, and a drain contact 268 is provided to establish electrical contact with the drain sinker 266. Source contacts 270, 272 are also formed in the oxide 264 to make contact with the n+ source regions 242, and gate contact 274 is formed in the oxide 264 to contact with the gate 262.

Figure 13:
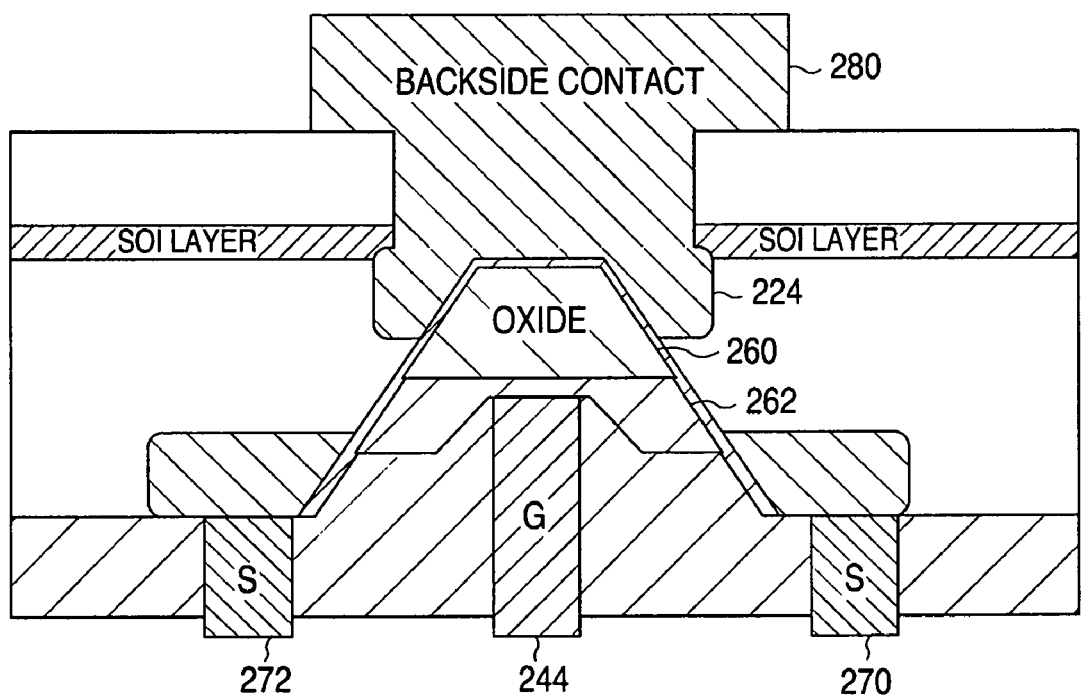
FIG. 13 shows a cross section through another embodiment of a HEMT of the invention.

Instead of establishing the drain contact from the top using a sinker to connect with the n+ drain 224 as shown in FIG. 12, another embodiment establishes a drain contact from the backside by depositing a thick metal layer 280 as shown in FIG. 13. This has the advantage, particularly in large transistor arrays, of reducing the resistance. The resultant structure is similar to the conceptual transistors shown in FIG. 2, however the FIG. 13 embodiment provides for the source contacts 270 lying outside the perimeter of the hole 202, and for a single gate contact 274. Also FIG. 2 does not show the n+ regions of the source and does not provide a gate oxide. Instead the conceptual structure of FIG. 2 provides for two separate gates 210.

The present invention thus opens the door to fabricating high voltage transistors with channels made from an increased mobility, wide band gap channel material such as GaN, which is useful for main voltage (110V) applications allowing them to be tied to the grid. One application is for the fabrication of grid-tie inverters on a chip, to reduce the cost and versatility of photo-voltaic (PV) energy production.

While the invention was described with respect to a few particular embodiments, it will be appreciated that the exact nature of the structures may vary without departing from the invention as defined by the claims.

What is claimed is:

1. A high electron mobility transistor (HEMT) that includes a channel region made from a high carrier mobility material, wherein the high carrier mobility material has a higher carrier mobility than silicon, comprising
a <100> orientation silicon wafer material that is processed to support the high carrier mobility channel region, wherein the high carrier mobility material comprises GaN.

2. A HEMT of claim 1, wherein the high carrier mobility material further comprises AlGaN to define a GaN/AlGan stack.

3. A HEMT of claim 1, wherein the <100> orientation silicon wafer material defines a <100> orientation substrate.

4. A HEMT of claim 3, wherein an epitaxial region is grown on top of the <100> orientation substrate, and the epitaxial region is etched to define a hole with at least one <111> orientation surface.

5. A HEMT of claim 4 wherein a SOI layer is formed on the <100> orientation substrate before the epitaxial region is grown.

6. A HEMT of claim 5, wherein the hole is substantially conical in cross-section and defines two <111> orientation surfaces.

7. A HEMT of claim 4, wherein the high carrier mobility material further comprises AlGaN to define a GaN/AlGan stack and the GaN/AlGaN stack is formed on the at least one <111> orientation surface.

8. A HEMT of claim 6, wherein the high carrier mobility material further comprises AlGaN to define a GaN/AlGan stack and the GaN/AlGaN stack is formed on the two <111> orientation surfaces.

9. A HEMT of claim 8, wherein a drain region of the HEMT is formed in the epitaxial region at or near the bottom of the epitaxial region.

10. A HEMT of claim 9, wherein a source region is formed in the epitaxial region above the drain region and spaced from the drain region.

11. A HEMT of claim 10, wherein the hole is etched through the source region and at least up to the drain region to define two source regions and at least one drain region.

12. A HEMT of claim 11, wherein the at least one drain region is contacted through at least one sinker.

13. A HEMT of claim 12, wherein the at least one drain region is contacted using a thick metal backend.

14. A HEMT of claim 13, wherein the thick metal back end is a copper back end.

* * * * *